(12) United States Patent
Pang et al.

(10) Patent No.: US 12,349,452 B2
(45) Date of Patent: Jul. 1, 2025

(54) BIPOLAR-CMOS-DMOS SEMICONDUCTOR DEVICE HAVING A DEEP TRENCH ISOLATION STRUCTURE FOR HIGH ISOLATION BREAKDOWN VOLTAGE

(71) Applicant: SK keyfoundry Inc., Cheongju-si (KR)

(72) Inventors: Yon Sup Pang, Cheonan-si (KR); Young Ju Kim, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 505 days.

(21) Appl. No.: 17/965,094

(22) Filed: Oct. 13, 2022

(65) Prior Publication Data

US 2023/0387104 A1 Nov. 30, 2023

(30) Foreign Application Priority Data

May 27, 2022 (KR) .................. 10-2022-0065094

(51) Int. Cl.
*H10D 84/40* (2025.01)
*H01L 21/764* (2006.01)

(52) U.S. Cl.
CPC .................................. *H10D 84/401* (2025.01)

(58) Field of Classification Search
CPC .... H10D 84/401; H10D 84/857; H10D 30/65; H10D 62/115; H01L 21/761; H01L 21/764; H01L 21/76232
See application file for complete search history.

(56) References Cited

U.S. PATENT DOCUMENTS

| | | | |
|---|---|---|---|
| 2005/0054157 A1 | 3/2005 | Hsu | |
| 2008/0258268 A1* | 10/2008 | Cheng | H10B 12/0387 438/386 |
| 2012/0175727 A1 | 7/2012 | Lin et al. | |
| 2013/0328123 A1 | 12/2013 | Chen et al. | |
| 2014/0291767 A1* | 10/2014 | Lee | H01L 21/764 438/422 |
| 2020/0343145 A1* | 10/2020 | Kang | H10D 30/0227 |
| 2020/0381424 A1 | 12/2020 | Shukla et al. | |
| 2020/0411360 A1* | 12/2020 | Tokumitsu | H01L 21/76888 |
| 2022/0406652 A1* | 12/2022 | Yang | H01L 23/535 |

* cited by examiner

*Primary Examiner* — David Vu
(74) *Attorney, Agent, or Firm* — NSIP Law

(57) ABSTRACT

A semiconductor device including: a semiconductor substrate including a buried layer; and a deep trench isolation a predetermined depth disposed starting from an upper surface of the semiconductor substrate, wherein the deep trench isolation includes: a first point disposed near the upper surface of the semiconductor substrate; a second point disposed near the buried layer; and a third point disposed near a bottom face of the deep trench isolation, and wherein the deep trench isolation has an inclination such that a width of the deep trench isolation increases from the second point to the third point, is disclosed.

17 Claims, 14 Drawing Sheets

BIPOLAR-CMOS-DMOS SEMICONDUCTOR DEVICE HAVING A DEEP TRENCH ISOLATION STRUCTURE FOR HIGH ISOLATION BREAKDOWN VOLTAGE

CROSS-REFERENCE TO RELATED APPLICATION

This application claims the benefit under 35 U.S.C. § 119 of Korean Patent Application No. 10-2022-0065094 filed on May 27, 2022, in the Korean Intellectual Property Office, the entire disclosure of which is incorporated herein by reference for all purposes.

BACKGROUND

1. Field

The following description relates to deep trench isolation structures for high isolation breakdown voltage in Bipolar-CMOS-DMOS (BCD) technology.

2. Description of Related Art

Typical Bipolar-CMOS-DMOS (BCD) semiconductor devices are BJTs, logic NMOS, PMOS, laterally diffused MOS transistor (LDMOS), and extended drain MOS transistor (EDMOS). Applications of the BCD semiconductor devices are PMIC (Power Management Integrated Circuit), automotive, DC-DC converter, battery chargers, audio amplifiers, and motor drivers, etc. Among the applications, PMIC supplies and manages a stable power to major chips like a display driver IC and timing controller, etc. implemented in LCD TV and monitor.

The BCD semiconductor devices have various operating voltages. The LDMOS and EDMOS devices may require a high drain operating voltage of 10-200V. On the other hand, CMOS devices such as NMOS and PMOS are logic devices, and they may require a low operating voltage such as 1.8V, 3.3V, or 5V. Therefore, when forming LDMOS, EDMOS, and CMOS devices together in a chip, a junction isolation structure or a deep trench isolation (DTI) structure may be implemented to separate the devices electrically. The chip area of the deep trench isolation structure may be smaller than that of the junction isolation structure.

When semiconductor devices with the DTI structure are manufactured in a BCD process, there is a limitation in increasing an isolation breakdown voltage. Additionally, the isolation breakdown voltage (in short, Iso BV) of the typical DTI is vulnerable to process variations.

SUMMARY

This Summary is provided to introduce a selection of concepts in a simplified form that are further described below in the Detailed Description. This Summary is neither intended to identify key features or essential features of the claimed subject matter, nor is it intended to be used as an aid in determining the scope of the claimed subject matter.

In one general aspect, a semiconductor device includes: a semiconductor substrate including a buried layer; and a deep trench isolation with a predetermined depth disposed starting from an upper surface of the semiconductor substrate, wherein the deep trench isolation includes: a first point disposed near the upper surface of the semiconductor substrate; a second point disposed near the buried layer; and a third point disposed near a bottom face of the deep trench isolation, and the deep trench isolation has an inclination such that a width of the deep trench isolation increases from the second point to the third point.

The second point may be disposed in contact with the buried layer.

The width of the deep trench isolation at the third point may be at least about 1.2 times greater than a width of the deep trench isolation at the first point.

An angle of the inclination of the deep trench isolation may be about 91° to 100° with respect to the upper surface of the semiconductor substrate.

TEOS oxide film or borophosphosilicate glass (BPSG) film may be disposed inside the deep trench isolation.

An air gap may be disposed between the second point and the third point.

The predetermined depth of the deep trench isolation may be greater than a depth of the buried layer.

The predetermined depth of the deep trench isolation may be about 20 um to 30 um.

The width of the deep trench isolation may be about 1.6 um to 4 um.

A first percentage of a first distance from the upper surface of the semiconductor substrate to the first point based on a total depth of the deep trench isolation may be 1 to 10%, a second percentage of a second distance from the upper surface of the semiconductor substrate to the second point based on the total depth of the deep trench isolation may be 20 to 35%, and a third percentage of a third distance from the upper surface of the semiconductor substrate to the third point based on the total depth of the deep trench isolation may be 90 to 100%, respectively.

In another general aspect, a semiconductor device includes: a semiconductor substrate including a highly doped buried layer; a deep trench isolation with a predetermined depth disposed starting from an upper surface of the semiconductor substrate, wherein the deep trench isolation includes: a first point disposed near the upper surface of semiconductor substrate; a second point disposed overlapping with the highly doped buried layer; a third point near a bottom face of the deep trench isolation; an air gap disposed between the second point and the third point; and a gap-fill insulating film surrounding the air gap, wherein the deep trench isolation has an inclination such that a width of the deep trench isolation increases from the second point to the third point.

The predetermined depth of the deep trench isolation may be greater than a depth of the highly doped buried layer.

The predetermined depth of the deep trench isolation may be about 20 um to 30 um.

The width of the deep trench isolation may be about 1.6 um to 4 um.

An angle of the inclination of the deep trench isolation between the second point and the third point may be about 91° to 100° with respect to the upper surface of the semiconductor substrate.

The semiconductor substrate further includes an epi layer disposed on the highly doped buried layer.

A first percentage of a first distance from the upper surface of the semiconductor substrate to the first point based on a total depth of the deep trench isolation may be 1 to 10%, a second percentage of a second distance from the upper surface of the semiconductor substrate to the second point based on the total depth of the deep trench isolation may be 20 to 35%, and a third percentage of a third distance from the upper surface of the semiconductor substrate to the third point based on the total depth of the deep trench isolation may be 90 to 100%, respectively.

Other features and aspects will be apparent from the following detailed description and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
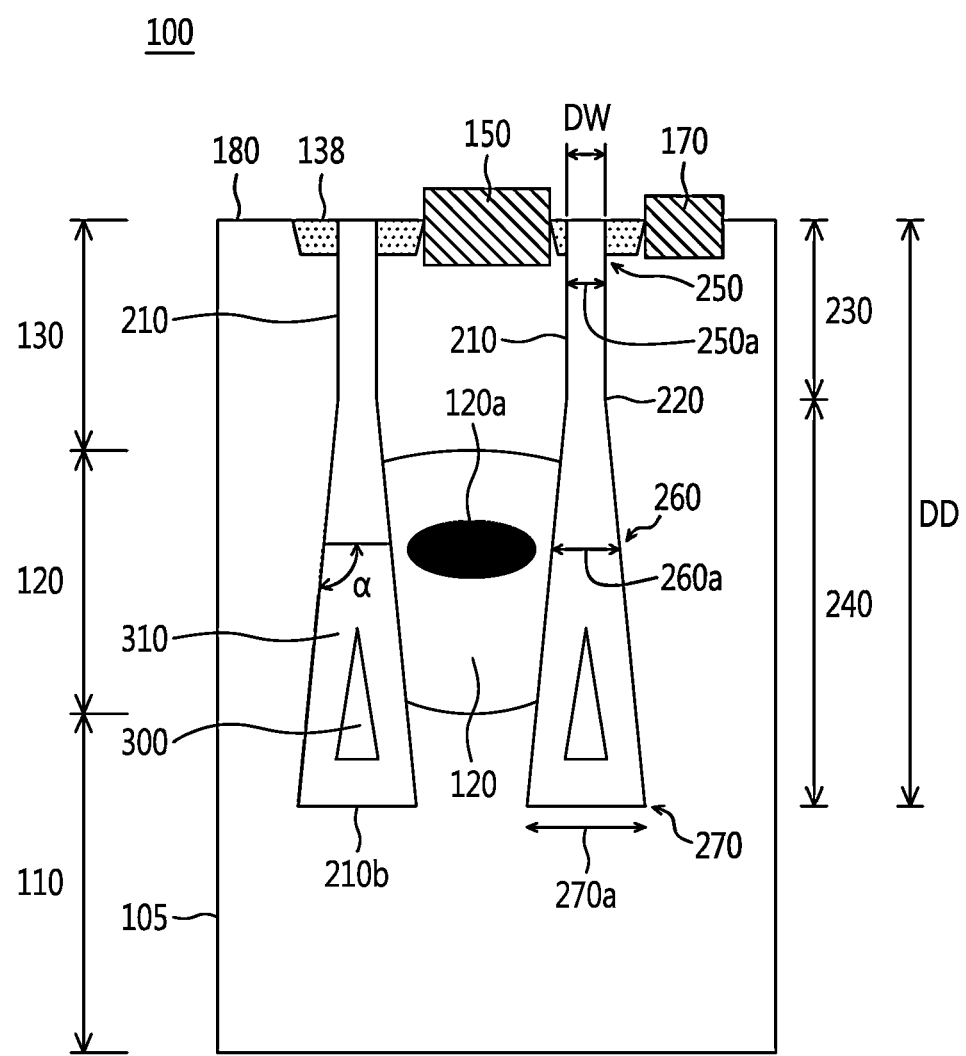
FIG. 1 illustrates a cross-sectional view of the semiconductor device in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A targeted problem of the disclosure is not limited by the problems mentioned above. A person skilled in the relevant field of technology may understand other problems from the following description.

A detailed description is given below, with attached drawings.

The example is to solve the above problem. The example may provide a semiconductor device that may secure a high isolation breakdown voltage (Iso BV) by changing DTI structure of the semiconductor device and minimize a variation of the isolation BV with manufacturing process variables. Novel robust DTI structure proposed in this patent increases Iso BV and controls variations of Iso BV with process variables.

FIG. 1 illustrates a cross-sectional view of a semiconductor device in accordance with one embodiment.

As illustrated in FIG. 1, a semiconductor device 100 includes a semiconductor substrate 105. The semiconductor substrate 105 may include a P-type substrate 110, an N-type buried layer (NBL) 120 disposed on the P-type substrate 110, and P-type epi layer 130 disposed on the N-type buried layer (NBL) 120. The semiconductor substrate 105 may further include a shallow trench isolation (STI) region 138, which may be disposed on an upper surface 180 of the semiconductor substrate 105.

The P-type substrate 110 is a silicon substrate that is uniformly doped with P-type dopants of first conductivity type (in short, P-type substrate or P-sub). The N-type buried layer (NBL) 120 is a highly doped region formed by ion implantation on the P-sub 110. The N-type buried layer 120 includes a most highly doped region 120a. The P-type epi layer 130 is doped with P-type dopants.

The first semiconductor device 150 and the second semiconductor device 170 may be disposed on the P-type epi layer 130. The first semiconductor device 150 may be a high voltage device such as LDMOS or EDMOS, and the second semiconductor device 170 may be a low voltage device such as logic NMOS or PMOS. Thus, in order to electrically separate the high voltage device 150 and the low voltage device 170 from each other, a deep trench isolation (DTI) structure 210 may be disposed therebetween.

In one or more embodiments, the DTI 210 may be formed with a width that becomes wider as it goes down into the P-sub 110. The width of DTI 210 is DW and the depth of DTI 210 is DD. In an example, the depth of the DTI 210 refers to the distance from the upper surface 180 to the bottom face 210b of the DTI 210. The bottom width of tapered conventional DTI is narrower than its top width, DW. The bottom width and the depth of tapered conventional DTI depend strongly on BCD process, which leads to variation of Iso BV with BCD process. The wider bottom width of the proposed DTI structure in FIG. 1 reduces variations of Iso BV with BCD process.

The DTI 210 may be divided into a vertical part 230 and an inclined part 240. The vertical part 230 refers to the DTI from the upper surface 180 of the semiconductor substrate 105 to the inflection point 220, where the inclination starts. The vertical part 230 may be formed, in which an outer wall of the DTI 210 is almost perpendicular or is at an angle of 85°-90°. The width of the vertical part 230 of the DTI 210 may be kept uniform or become narrower. Alternatively, the width of the vertical part 230 of the DTI 210 may become gradually increased.

The inclined part 240 of the DTI 210 may have a width increasing downward. The inclined part 240 may have a slant shape from the inflection point 220 to the bottom face 210b of the DTI 210. The inclined part 240 may be formed at an oblique direction with a predetermined inclination angle α. The inclination angle α may be, such as, 91° to 100°.

Alternatively, in accordance with one or more embodiments, the DTI 210 structure may be formed, without the vertical part 230, or with a width that becomes gradually increasing starting from the upper surface 180 of the semiconductor substrate 105 downward and with a predetermined inclination angle α.

The width 250a of the DTI 210 is the first width at the first point 250 which is located near the upper surface 180. The width 260a of the DTI 210 is the second width at the second point 260, which is located around the center of the DTI. The DTI around the second point 260 may overlap with the buried layer 120. Therefore, the second point 260 may be located overlapping with the buried layer 120, particularly overlapping with the most-highly doped region 120a of the buried layer 120. The width 270a of the DTI 210 is the third width at the third point 270, which is near the bottom face 210b of the DTI 210.

A percentage of a distance from the upper surface of the semiconductor substrate to the first point based on a total depth of the deep trench isolation may be 1 to 10%. A percentage of a distance from the upper surface of the semiconductor substrate to the second point based on the total depth of the deep trench isolation may be 20 to 35%. Also, a percentage of a distance from the upper surface of the semiconductor substrate to the third point based on the total depth of the deep trench isolation is 90 to 100%.

Therefore, for example, where the depth of the deep trench isolation is 20 um, from the upper surface of the substrate, the first point may be located at 0.2 um to 2 um, the second point may be located at 4 um to 7 um, and the third point may be located at 18 um to 20 um.

At the second point 260, the width of the deep trench isolation is greater than that at the first point 250. In addition, the width of the deep trench isolation may increase from the second point 260 toward the third point 270. The width 270a at the third point 270 of the inclined part 240 may be at least 1.2 times greater than the width 250a at the first point 250 of the vertical part 230.

Additionally, the DTI 210 may be formed to be deeper than the N-type buried layer 120, starting from the upper surface 180 of the semiconductor substrate 105. The inside of the DTI 210 may be filled with a gap-fill insulating film 310. As the gap-fill insulating film 310, materials, such as, PECVD TEOS oxide film, LPCVD TEOS oxide film, or borophosphosilicate glass (BPSG) film, etc. may be used, but is not limited thereto. Alternatively, it may be a gap-fill insulating film filled with a plurality of the above-indicated oxide films. Alternatively, both the gap-fill insulating film 310 and an air gap 300 may be formed inside the DTI 210. The air gap 300 may be surrounded with the gap-fill insulating film 310. The gap-fill insulating film 310 may be deposited by a CVD method. The inside of the DTI 210 may not be entirely filled in the process of the filling, thus an empty space, such as the air gap, an air space, or a void, etc. may be formed.

To block a leakage current, a channel stopping layer may be formed at the bottom face of the DTI 210 by an ion implantation.

If the air gap 300 is formed inside the DTI 210, the air gap 300 (referring to FIGS. 9 and 10) may be disposed overlapped with or lower than PN junction boundary of the P-sub 110 and the N-type buried layer 120.

Figure 2:
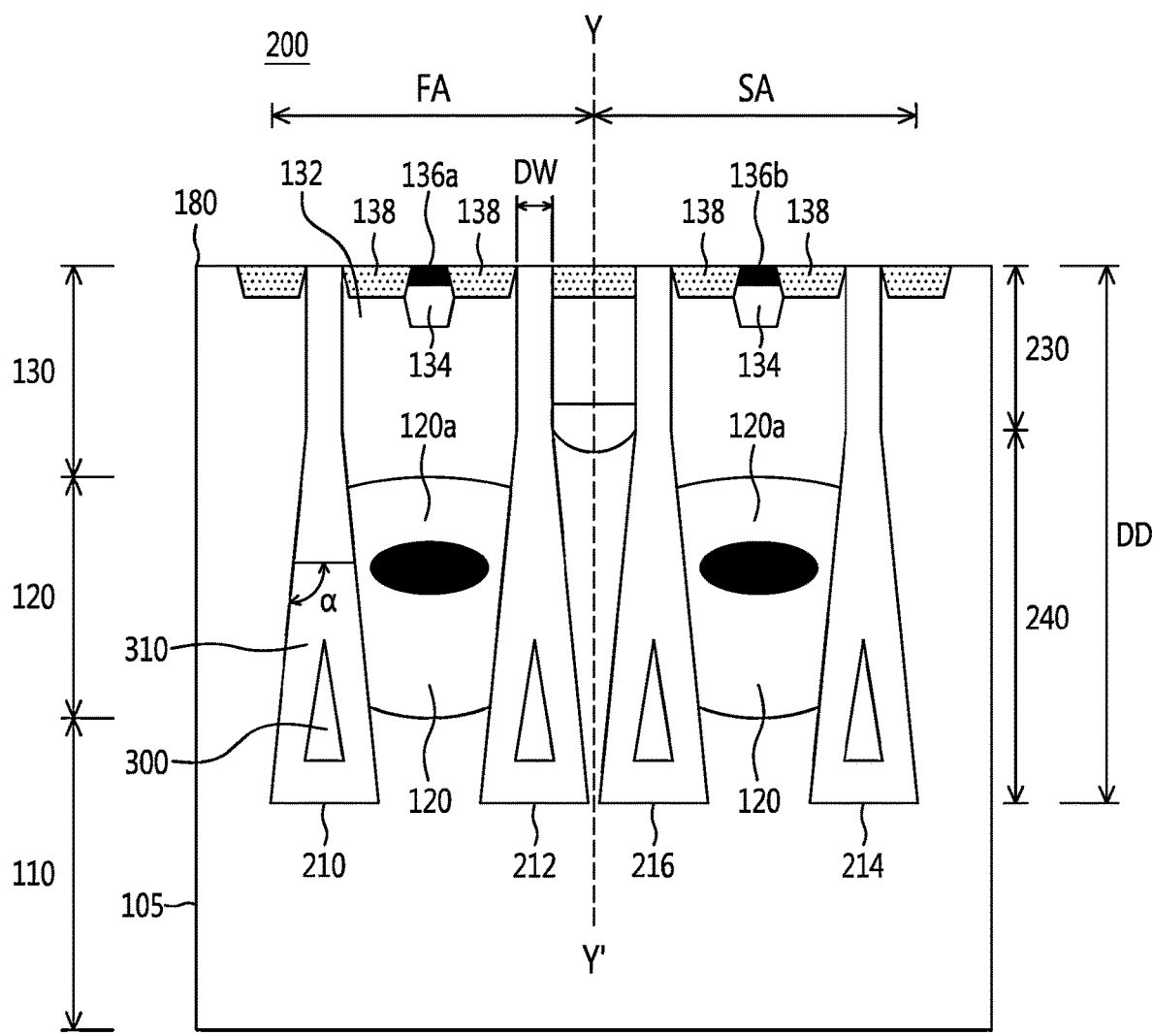
FIG. 2 illustrates a schematic diagram for a device simulation to obtain an isolation breakdown voltage (Iso BV).

FIG. 2 illustrates a schematic diagram on a parasitic BJT and DTIs for a device simulation to obtain an isolation breakdown voltage (BV).

In FIG. 2, the semiconductor device 200 includes a plurality of DTI structures, where four DTIs 210, 212, 214, 216 are formed. The semiconductor device 200 may be divided, with reference to an imaginary line Y-Y' at the center of the device 200, into the first DTI structure of first area FA at the left side and the second DTI structure of the second area SA at the right side. The first DTI structure and the second DTI structure may be symmetric to each other with respect to the imaginary line. A collector 136a and an emitter 136b are located at the first area FA and the second area SA, respectively.

The first DTI structure includes DTI 210 and DTI 212. The second DTI structure includes DTI 214 and DTI 216, and the DTI 212 and the DTI 216 may be formed to be spaced apart by a predetermined distance.

The P-type epi layer 130 includes a high voltage N-type well region (HDNW) 132 lightly doped with N-type dopants, an N-type well region (NW) 134 formed in the HDNW region 132, and highly doped N+ region 136a or 136b formed in the NW 134. The highly doped N+ region may be a collector 136a or an emitter 136b. That is, at the upper surface 180 of the semiconductor substrate 105, the collector 136a and the emitter area 136b of the highly doped regions are formed, and the collector 136a and the emitter 136b may be doped with N+ dopants of second conductivity type. A collector electrode may be electrically connected to the collector 136a, and an emitter electrode may be electrically connected to the emitter 136b.

The shallow trench isolation region 138 with shallow trench may be formed at the left and the right sides of the highly doped N+ region 136a and 136b as well as the DTIs 210, 212, 214, and 216. The shallow trench isolation region 138 may be formed deeper than the N+ region 136a and 136b and shallower than the NW 134.

In one or more embodiments, in the semiconductor device having the structure of FIG. 2, the variation of the isolation BV may be minimized and the isolation BV may increase through a design that optimizes the parameters of DTI depth, width and angle. Hereinafter, effects of isolation BV based on the DTI parameters are described with reference to simulation results. Simulations in accordance with one or more embodiments will be based on 0.18 µm BCD process.

Figure 3:
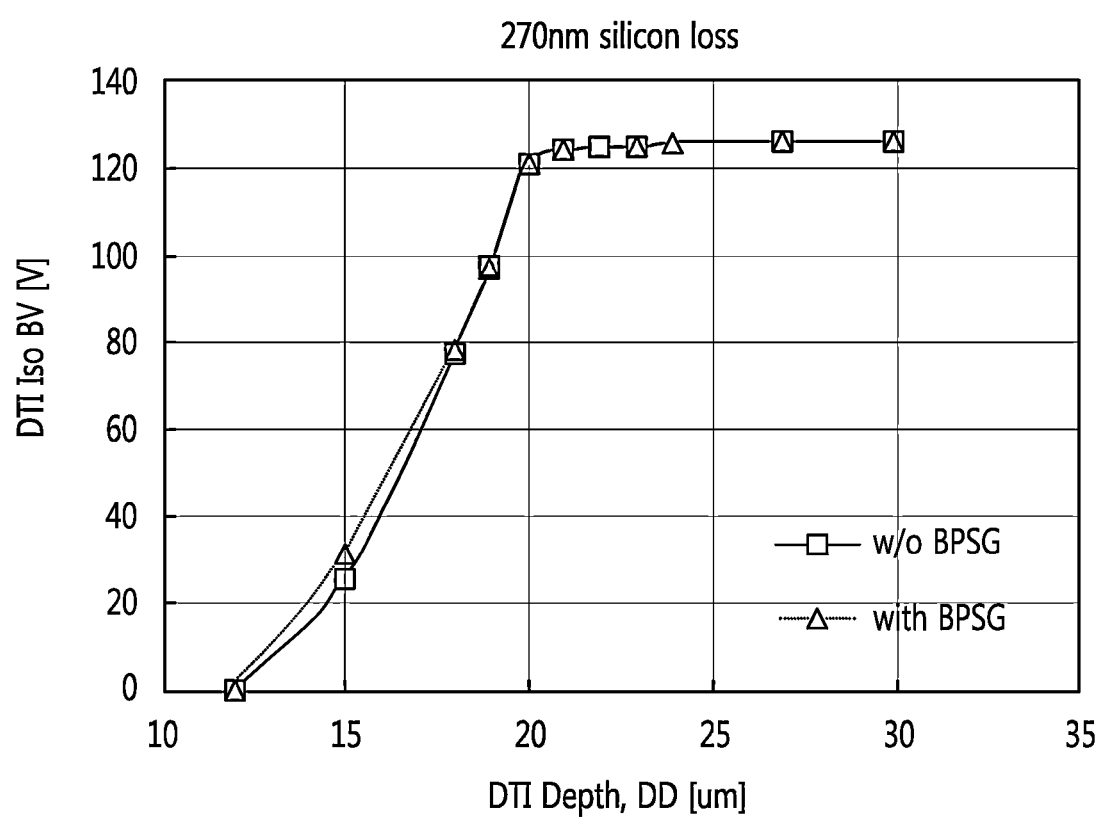
FIG. 3 illustrates a design curve to indicate a relationship between a DTI depth and isolation BV when the thickness of etched silicon is 270 nm in accordance with one or more embodiments.

FIG. 3 illustrates the design curve to indicate the relationship between the DTI depth and the isolation BV when the thickness of etched silicon is 270 nm accordance with one or more embodiments.

In DTI formation process, after a deep trench is formed, a side wall insulating film (not illustrated) is deposited on the side wall of the deep trench. Etch-back process is performed to the side wall insulating film such that a side wall insulating film spacer (not illustrated) is formed on the side wall. Performing additional etching at the bottom side of the deep trench in a later step is called as silicon etching. The thickness of etched silicon of 270 nm means that the silicon loss due to etching is 270 nm. It also means that the depth of the deep trench may increase about 270 nm more.

Figure 4:
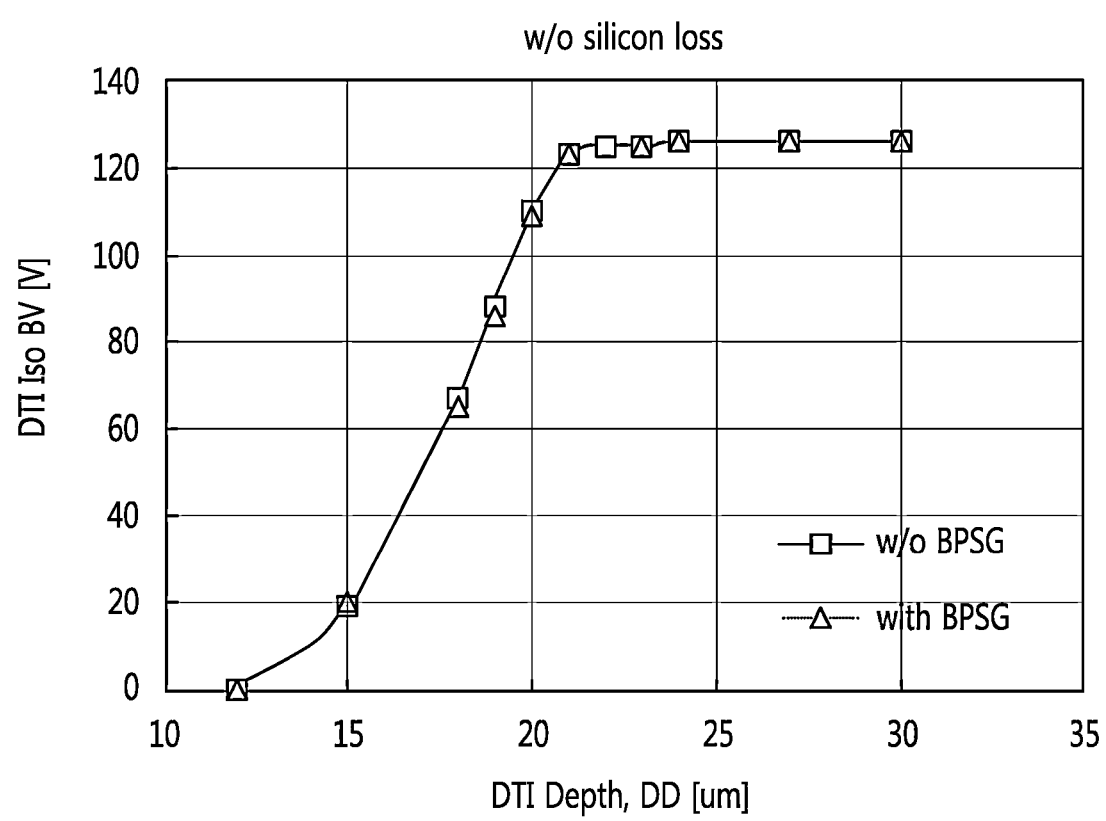
FIG. 4 illustrates a design curve to indicate a relationship between a DTI depth and isolation BV without silicon loss in accordance with one or more embodiments.

FIG. 4 illustrates the design curve to indicate the relationship between the DTI depth and the isolation BV without silicon loss in accordance with one or more embodiments.

FIGS. 3 and 4 illustrate design curves to indicate a relationship between the deep trench isolation (DTI) depth and the isolation BV in accordance with one or more embodiments. FIGS. 3 and 4 also illustrate simulation results on the dependency of Iso BV of the parasitic BJT on DTI depth, BPSG and silicon loss caused by DTI process.

In FIGS. 3 and 4, simulations were conducted only adjusting DTI depth while the DTI width is fixed at 1.6 µm and the DTI angle (a) is fixed at 89.4°. The design curves show that variations of the isolation BV of the proposed DTI structures with process variables.

Reviewing the simulation results, in FIGS. 3 and 4, it can be seen that, if DTI depth exceeds about 21 µm, the isolation BV becomes stable to 120V independently of BPSG process for the DTIs 210, 212, 214 and 216.

FIGS. 3 and 4 show that the isolation BV is almost independent of the silicon loss due to DTI etch process for DTI depth greater than 21 µm. Borophosphosilicate glass (BPSG) and silicon loss due to DTI process are negligible. BPSG is known to be good gap-fill material to prevent void in DTI.

The newly found design curves for the BCD parasitic BJT and DTI in FIGS. 3 and 4 show that Iso BV is improved and the variations of Iso BV with the process variables are minimized for DTI depth greater than 21 µm.

Figure 5:
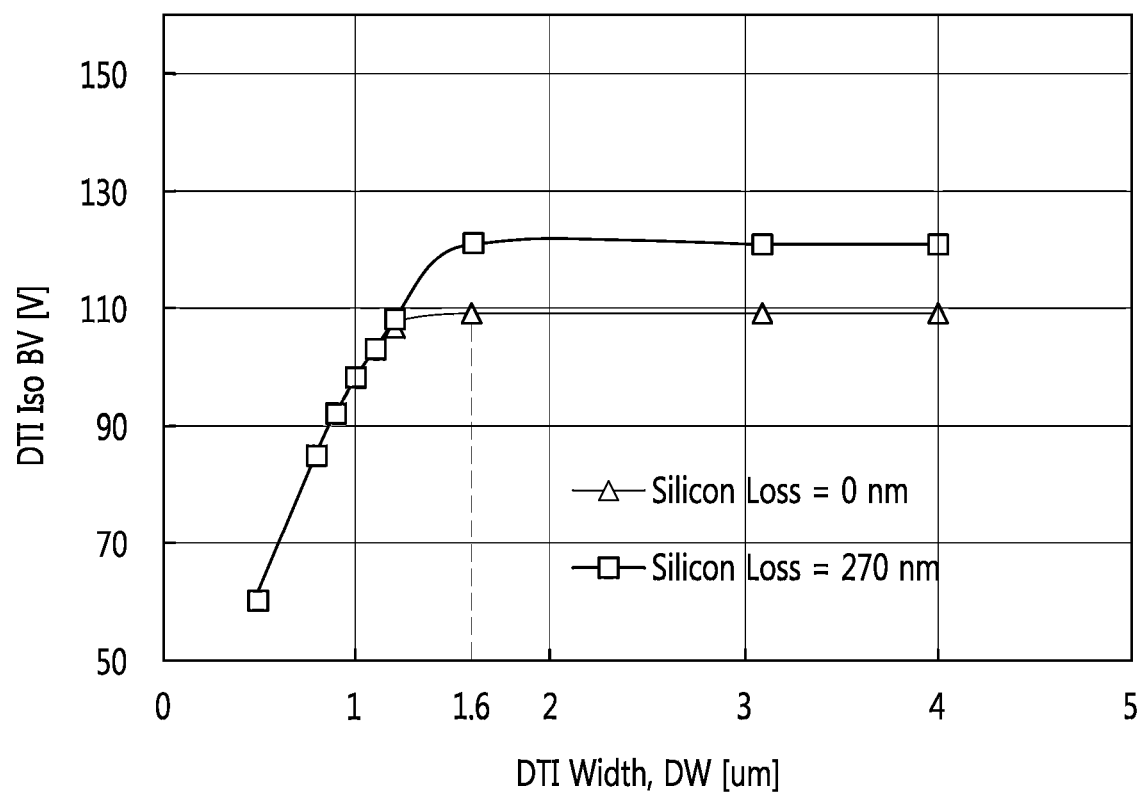
FIG. 5 illustrates a design curve to indicate a relationship between a DTI width and isolation BV in accordance with one or more embodiments.

FIG. 5 illustrates a design curve to indicate the relationship between a DTI width and an isolation BV in accordance with one or more embodiments.

In FIG. 5, a simulation was conducted, adjusting the DTI width only while the DTI depth is fixed at 20 µm and the DTI angle is fixed at 89.4°. The design curves for the thicknesses, 0 nm and 270 nm of the silicon lost under the DTI during DTI etch process, are illustrated in FIG. 5.

Reviewing the simulation results, the isolation BV significantly changes when the DTI width is less than about 1.6 µm. On the other hand, the Iso BV becomes stable to a fixed Iso BV value for the DTI width greater than 1.6 µm. The fixed Iso BV of 270 nm silicon loss is higher than that of 0 nm silicon loss.

Figure 6:
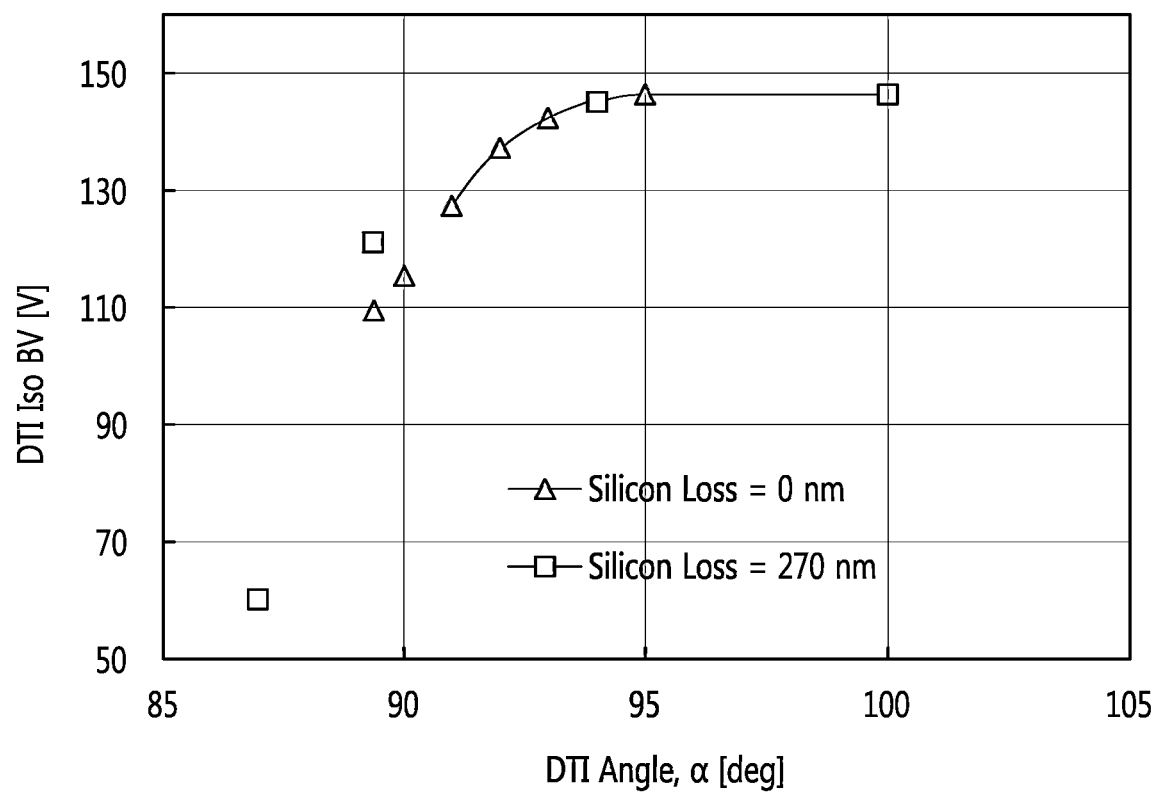
FIG. 6 illustrates a design curve to indicate a relationship between a DTI angle and isolation BV in accordance with one or more embodiments.

FIG. 6 illustrates a design curve to indicate the relationship between a DTI angle and an isolation BV in accordance with one or more embodiments.

In FIG. 6, a simulation was conducted, adjusting DTI angle only while the DTI depth is fixed at 20 µm and DTI width is fixed at 1.6 µm. The design curves for the thicknesses, 0 nm and 270 nm of the silicon lost under the DTI during DTI etch process, are illustrated in FIG. 6.

Reviewing the simulation results, it can be seen that the silicon etching for DTI does not affect significantly and that the isolation BV becomes stable to the fixed Iso BV=146V for the DTI angle greater than 94°.

When DTI is formed increasing the DTI angle (a) from 89.4° to about 94.2°, the isolation BV gradually increases from 110V to 146V. Thus, when a silicon substrate is etched in order to form a DTI of a semiconductor device, it may be desirable to have a DTI that is vertical from the upper surface of the semiconductor substrate to a predetermined point and that becomes wider from the predetermined point toward the bottom face of the DTI.

As explained in FIGS. 5 and 6, the isolation BV increases as the width or the angle of the DTI increases and the isolation BV becomes saturated to a fixed Iso BV. Therefore, the DTI may be well designed that, with regard to DTI parameters in accordance with one or more embodiments, the DTI depth 20 µm or more, the DTI width 1.6-4 µm, and the DTI angle (a in FIG. 2) 90° or more (94° to 100°).

FIGS. 7 to 10 illustrate simulation results on different devices depending on DTI angle in accordance with one or more embodiments. In FIGS. 7 to 10, while the DTI depth is fixed at 20 µm and the DTI width fixed at 1.6 µm, only DTI angles are different.

Figure 7:
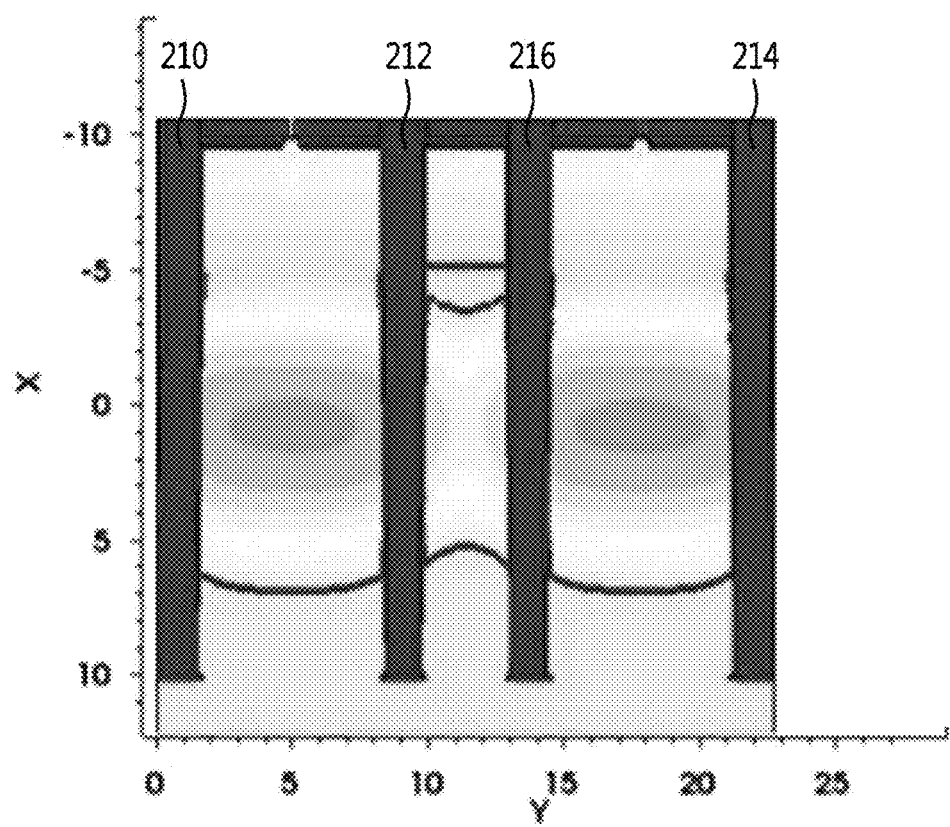
FIGS. 7 to 10 illustrate device simulation results on DTI structure depending on DTI angle in accordance with one or more embodiments.

FIG. 7 illustrates the cross-sectional view of a semiconductor device where the DTI angle is 89.4°. The DTI 210, 212, 216 and 214 have the inclination with respect to the upper surface of the semiconductor substrate. Since the DTI angle is 89.4°, the DTI width becomes narrower as going down towards the DTI bottom.

Figure 8:
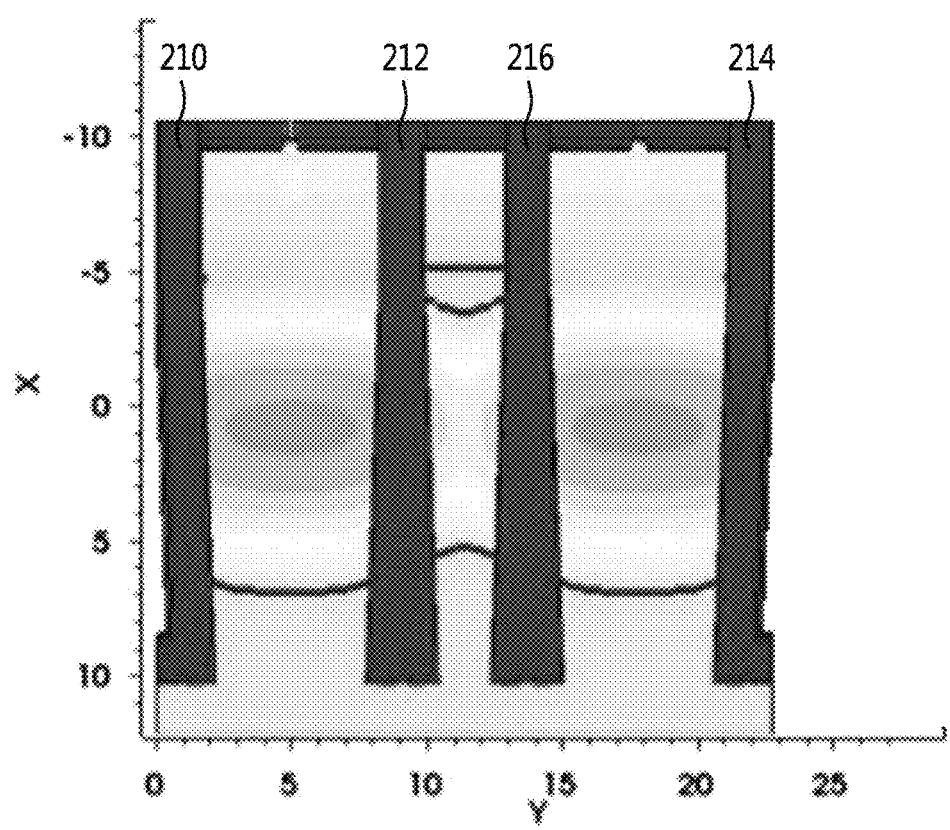

In FIG. 8, the inclination angle of the DTI 210, 212, 214 and 216 is α=92° at the center point, such as the inflection point 220 in FIG. 1. A totally different profile is formed from the profile of the DTI 210 illustrated in FIG. 7. In short, the DTI width may become gradually wider in the lower portion of the DTI.

Figure 9:
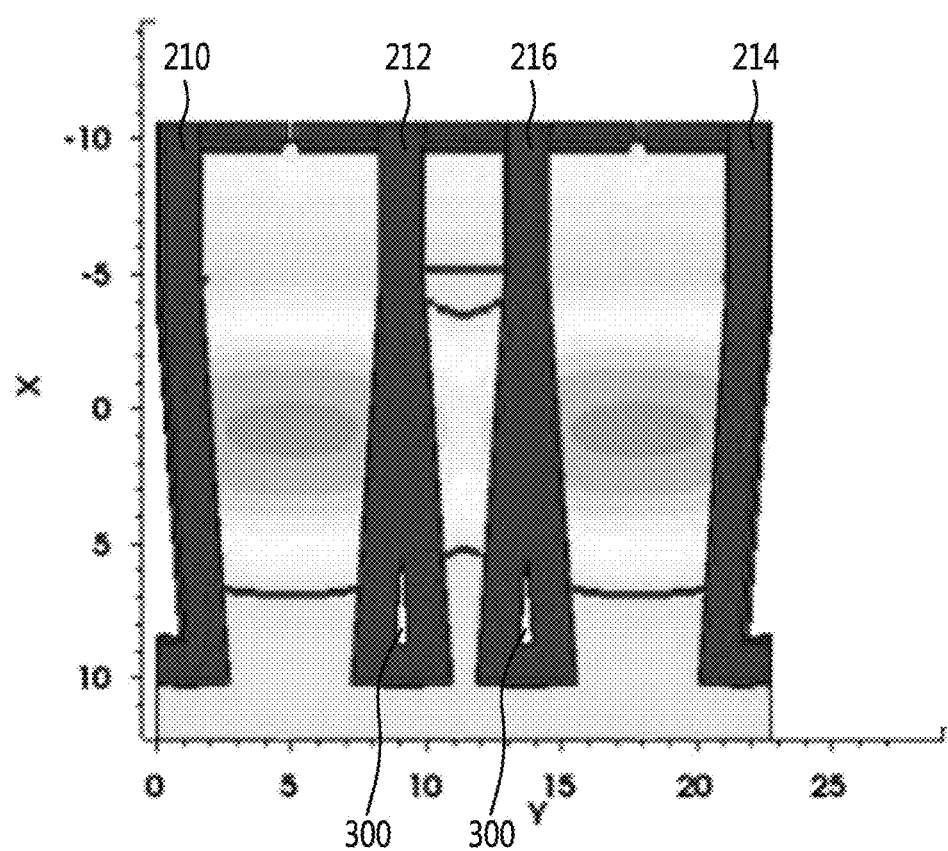

FIG. 9 illustrates DTI with the inclination angle $\alpha=94°$. The DTI width in the lower portion is wider than that of FIG. 8.

Figure 10:
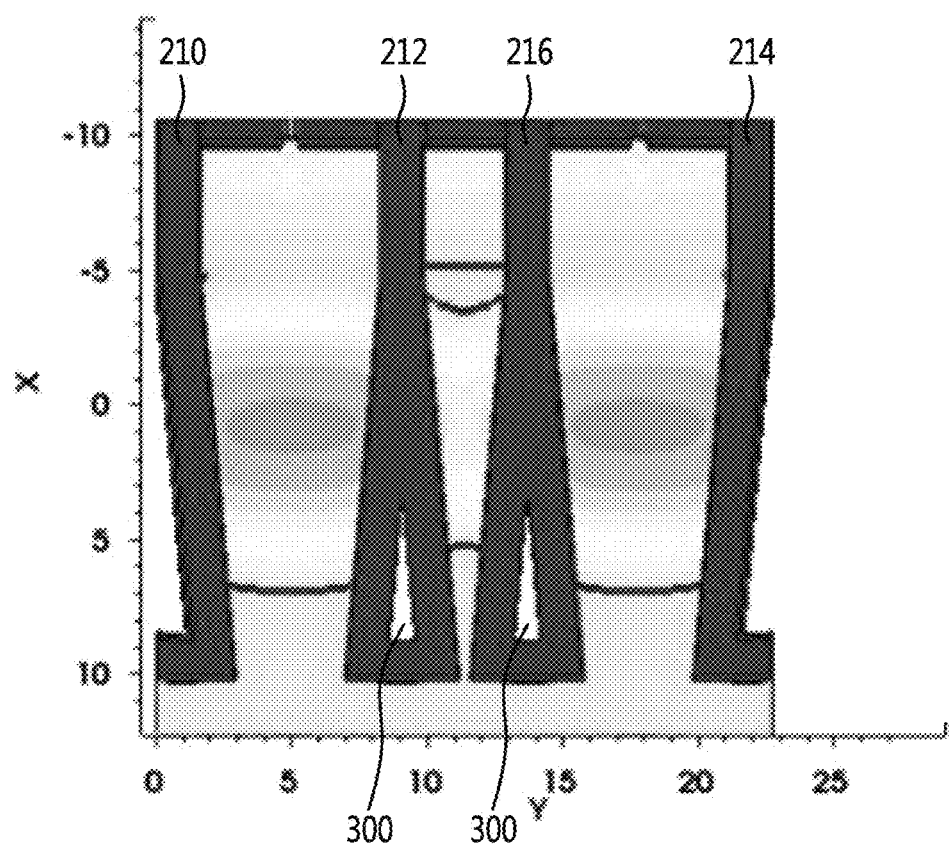

FIG. 10 illustrates DTI with the inclination angle $\alpha=95°$. The DTI width in the lower portion is wider than that of FIG. 9.

In FIGS. 9 and 10, the air gap 300 is formed in each of the DTI 210, 212, 214 and 216. The air gap in FIG. 10 may be formed larger than the air gap of FIG. 9. The air gap 300 is located across the junction boundary of the P-sub 110 and the N-type buried layer 120.

Additionally, as illustrated in FIGS. 8 to 10, even if the angles of the DTI are designed differently, the DTIs are formed in the same doping profiles of the devices.

Figure 11:
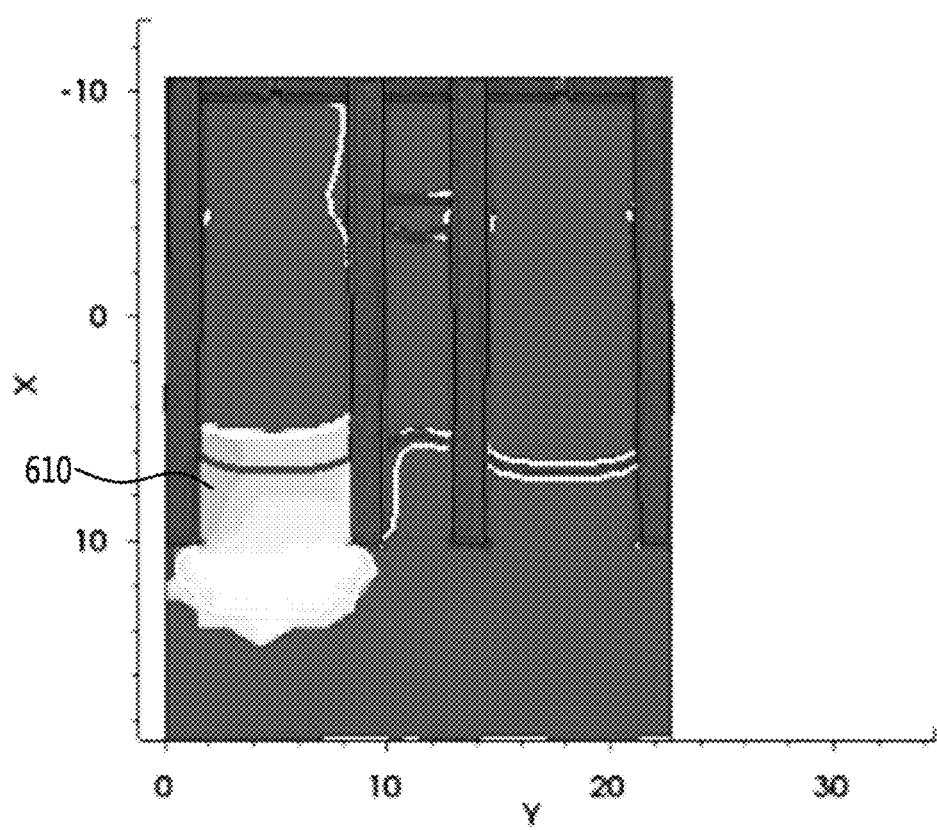
FIGS. 11 to 13 illustrate simulated impact ionization rate contours of the parasitic NPN BJTs with different DTI depths and DTI angles in accordance with one or more embodiments.
Figure 12:
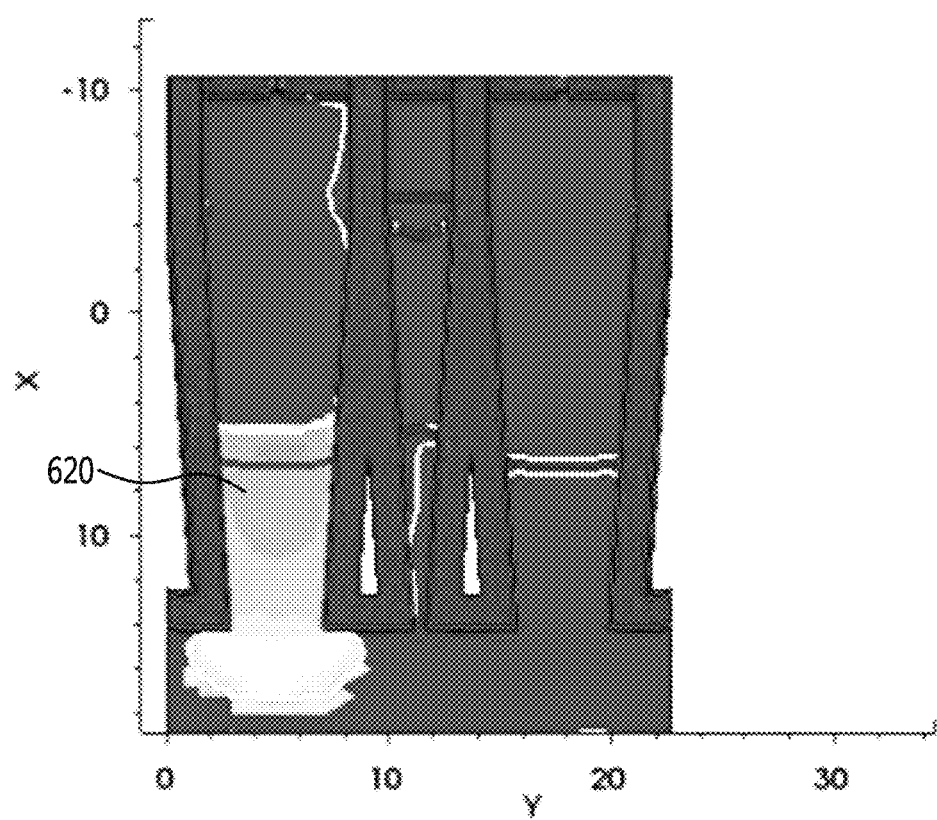
Figure 13:
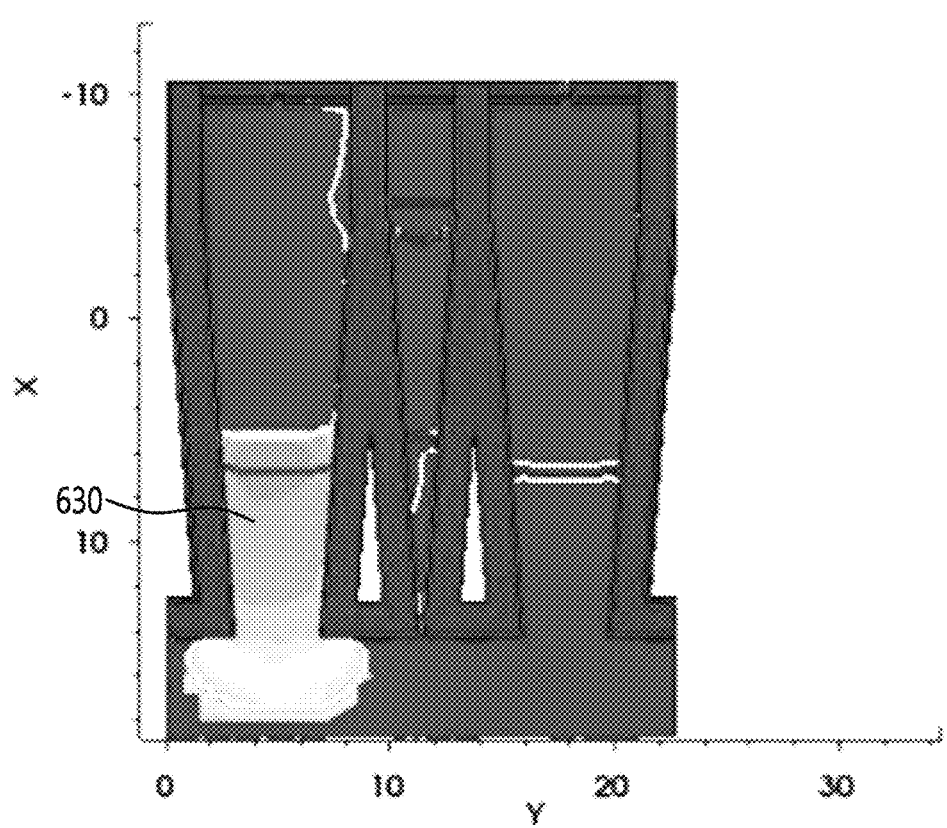

FIGS. 11 to 13 illustrate simulation results to indicate impact ionization rate contours in semiconductor devices with different DTI depths and DTI angles in accordance with one or more embodiments.

FIG. 11 illustrate the impact ionization rate contours of the semiconductor device with the DTI depth of 20 μm, the DTI angle $\alpha$ of 89.4°, and the DTI width of 1.6 μm.

FIG. 12 illustrates the impact ionization rate contours of the semiconductor device with the DTI depth of 24 μm, the DTI angle $\alpha$ of 93.7°, and the DTI width of 1.6 μm.

FIG. 13 illustrates the impact ionization rate contours of the semiconductor device with the DTI depth of 24 μm, the DTI angle $\alpha$ of 94.2°, and the DTI width of 1.6 μm.

Referring to FIG. 11, it can be seen that the impact ionization rate contours are concentrated at the area 610. In this case, the breakdown voltage of the device is inevitably vulnerable to local high electric fields. The isolation BV of the semiconductor device in FIG. 11 is merely 110V.

However, referring to FIGS. 12 and 13, it can be seen that the impact ionization rate contours are uniformly distributed at the areas 620 and 630, compared to FIG. 11. In addition, if the angle of the DTI is greater as in FIG. 13, the impact ionization rate contours are distributed more uniformly. Referring to FIGS. 11 to 13, it can be seen that, when DTI depth and DTI angle increase while DTI width is fixed, electrical fields or ionization rate contours are more uniformly distributed in a depletion region across the boundary of the N-type buried layer 120 and the P-sub 110. If the DTI angle is increased more while the DTI depth is constant, the ionization rate contours are more uniformly distributed in a depletion region.

That is because the DTIs 210, 212, 214 and 216 in accordance with one or more embodiments have the width that becomes wider toward the bottom and each of the distances between the DTIs 210, 212, 214 and 216 become narrower. It increases the isolation BV. Therefore, the isolation BVs of FIGS. 12 and 13 are 208V and 215V, respectively, which are greater than those of the conventional art.

In short, the isolation BV may be improved to 208V and 215V, which are greater than the conventional art's Iso BV 110V, by properly adjusting DTI depth and DTI angle of the semiconductor device.

Figure 14:
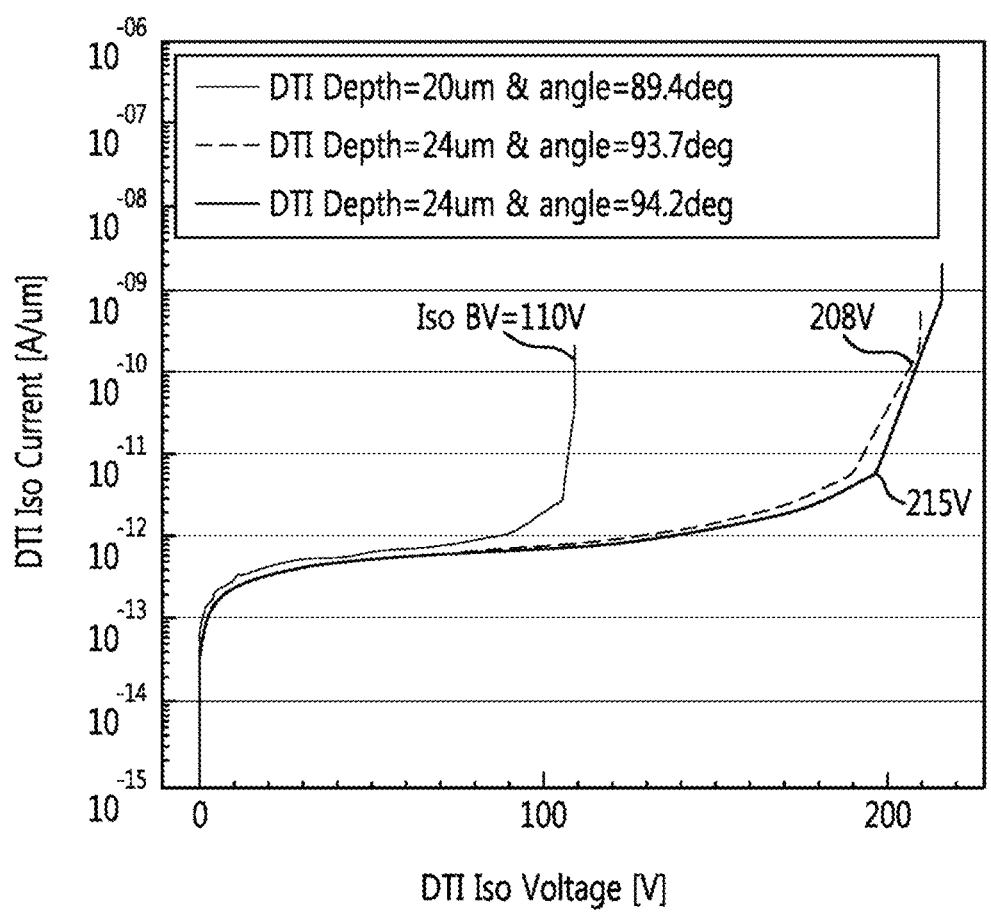
FIG. 14 illustrates I-V curve & Iso BV of the semiconductor device with the robust DTI structure in accordance with one or more embodiments.

FIG. 14 illustrates I-V curve & Iso BV of the semiconductor device with the robust DTI structure. DTI Iso BV can be improved from 110V to 215V by adjusting both DTI depth and angle.

According to the above examples, a breakdown voltage performance of the semiconductor device may be improved because the impact ionization rate contour may be formed more widely and evenly in the depletion area between DTIs.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
a semiconductor substrate comprising a buried layer; and
a deep trench isolation a predetermined depth disposed starting from an upper surface of the semiconductor substrate,
wherein the deep trench isolation comprises:
a first point disposed near the upper surface of the semiconductor substrate;
a second point disposed near the buried layer; and
a third point disposed near a bottom face of the deep trench isolation, and
wherein the deep trench isolation has an inclination such that a width of the deep trench isolation increases from the second point to the third point.

2. The semiconductor device of claim 1,
wherein the second point is disposed in contact with the buried layer.

3. The semiconductor device of claim 1,
wherein a width of the deep trench isolation at the third point is at least about 1.2 times greater than a width of the deep trench isolation at the first point.

4. The semiconductor device of claim 1,
wherein an angle of the inclination of the deep trench isolation is about 91° to 100° with respect to the upper surface of the semiconductor substrate.

5. The semiconductor device of claim 1,
wherein TEOS oxide film or borophosphosilicate glass (BPSG) film is disposed inside the deep trench isolation.

6. The semiconductor device of claim 1,
wherein an air gap is disposed between the second point and the third point.

7. The semiconductor device of claim 1,
wherein the predetermined depth of the deep trench isolation is greater than a depth of the buried layer.

8. The semiconductor device of claim 1,
wherein the predetermined depth of the deep trench isolation is about 20 μm to 30 μm.

9. The semiconductor device of claim 1,
wherein a width of the deep trench isolation is about 1.6 μm to 4 μm.

10. The semiconductor device of claim 1,
wherein a first percentage of a first distance from the upper surface of the semiconductor substrate to the first point based on a total depth of the deep trench isolation is 1 to 10%, a second percentage of a second distance from the upper surface of the semiconductor substrate to the second point based on the total depth of the deep trench isolation is 20 to 35%, and a third percentage of a third distance from the upper surface of the semiconductor substrate to the third point based on the total depth of the deep trench isolation is 90 to 100%, respectively.

11. A semiconductor device comprising:
a semiconductor substrate comprising a highly doped buried layer;
a deep trench isolation with a predetermined depth disposed starting from an upper surface of the semiconductor substrate,
wherein the deep trench isolation comprises:
a first point disposed near the upper surface of semiconductor substrate;
a second point disposed overlapping with the highly doped buried layer;
a third point disposed near a bottom face of the deep trench isolation;
an air gap disposed between the second point and the third point; and
a gap-fill insulating film surrounding the air gap, and
wherein the deep trench isolation has an inclination such that a width of the deep trench isolation increases from the second point to the third point.

12. The semiconductor of claim 11,
wherein the predetermined depth of the deep trench isolation is greater than a depth of the highly doped buried layer.

13. The semiconductor device of claim 11,
wherein the predetermined depth of the deep trench isolation is about 20 μm to 30 μm.

14. The semiconductor device of claim 11,
wherein a width of the deep trench isolation is about 1.6 μm to 4 μm.

15. The semiconductor device of claim 11,
wherein an angle of the inclination of the deep trench isolation between the second point and the third point is about 91° to 100° with respect to the upper surface of the semiconductor substrate.

16. The semiconductor device of claim 11,
wherein the semiconductor substrate further comprises an epi layer disposed on the highly doped buried layer.

17. The semiconductor device of claim 11,
wherein a first percentage of a first distance from the upper surface of the semiconductor substrate to the first point based on a total depth of the deep trench isolation is 1 to 10%, a second percentage of a second distance from the upper surface of the semiconductor substrate to the second point based on the total depth of the deep trench isolation is 20 to 35%, and a third percentage of a third distance from the upper surface of the semiconductor substrate to the third point based on the total depth of the deep trench isolation is 90 to 100%, respectively.

* * * * *